United States Patent [19]

Miyake et al.

[11] 3,769,560

[45] Oct. 30, 1973

[54] HERMETIC CERAMIC POWER PACKAGE FOR HIGH FREQUENCY SOLID STATE DEVICE

[75] Inventors: Shin Ichi Miyake, Kyoto; Kazunari Sakai, Kagoshima-ken, both of Japan

[73] Assignee: Kyoto Ceramic Co., Ltd., Kyoto-shi, Japan

[22] Filed: Sept. 18, 1972

[21] Appl. No.: 289,963

[30] Foreign Application Priority Data

Oct. 2, 1971 Japan ................................ 46/77365

[52] U.S. Cl....... 317/234 R, 317/234 A, 317/234 G, 174/52 S

[51] Int. Cl............................. H01l 3/00, H01l 5/00

[58] Field of Search .................... 317/234, 1, 4, 4.1, 317/5.4; 174/52 S, DIG. 5, 15 R; 333/84 M

[56] References Cited

UNITED STATES PATENTS

| | | | |
|---|---|---|---|
| 3,479,570 | 11/1969 | Gilbert | 317/234 G |
| 3,626,259 | 12/1971 | Garboushian | 317/235 N |
| 3,651,434 | 3/1972 | McGeough et al. | 317/23 AG |
| 3,659,035 | 4/1972 | Planzo | 317/234 J |
| 3,665,592 | 3/1970 | Apospors | 317/234 G |
| 3,681,513 | 8/1972 | Hargis | 317/234 AG |

*Primary Examiner*—John W. Huckert
*Assistant Examiner*—Andrew J. James
*Attorney*—Spensley, Horn & Lubitz

[57] ABSTRACT

This invention relates to a semiconductor device and more particularly to a semiconductor device increased in performance reliability by improving the fragility effected by heat and a lapse of time on the semiconductor device such as power transistor, Thyristor, Triac, etc.

5 Claims, 5 Drawing Figures

HERMETIC CERAMIC POWER PACKAGE FOR HIGH FREQUENCY SOLID STATE DEVICE

BACKGROUND OF THE INVENTION

This invention relates to a semiconductor device, and more particularly to a high frequency power transistor and the like.

A semiconductor device used in an electronics machine and apparatus, particularly a power transistor, although small in size as well known, produces high output and accordingly considerably high heat from a semiconductor element during use. But the characteristics of the element itself vary in accordance with temperatures, and accordingly in order for the element to produce its normal function, it is absolutely necessary to maintain the temperatures below the specified range of temperatures (below 450°C in the case of silicon diode). Therefore, such a structure is employed in which the heat emitted during use from the element is conducted as quickly as positively as possible to the chassis side by using ceramics material of high conductivity in the header of the transistor and is thus radiated.

Referring now to the typical structure of such a transistor in conjunction with FIG. 5 of the drawings, a base *b* of beryllium ceramics is soldered with Ag.-Cu eutectic alloy solder *c* to the entire surface of the top of a base (stud) *a* of high purity copper, a semiconductor element (or chip) *e* is soldered with Au-Si eutectic alloy solder *f* to the top surface of the base *b* and further soldered with Ag-Cu eutectic alloy solder to electroconducting areas *h* . . . having the required number of leads *g* fixed by metalizing to the top surface end of the base *b*, and still further the electroconducting areas *h* . . . and said semiconductor element *e* are connected by wire bondings *i* . . . . In order to hermetically seal the thus obtained header with a cap, a metal mold is filled with a silicon resin compound while the header is being held in the mold, and the compound is subjected to heat molding to form the compound and a cap *d* of an inverted U-section into one body in a cap receipt airtight manner bu putting the cap on the header in the state of connection shown in FIG. 5. The structure of the type described above can achieve an intended object by not only shielding the element *e* from outside atmosphere by means of the cap *d* but also quickly transferring the loss heat of the element *e* produced during use to a chassis side (not shown) from the heat conducting base *b* and the stud *a*.

But the power transistor of the prior art type described above still leaves the following problematic points of importance to solve.

1. Reliability yet to be desired in performance:

As described above, the cap *d* is obtained by heat molding of a silicon resin compound, but the compound is originally low in airtightness ($10^{-8}$ Torr max), so that it deteriorates in airtightness during years of service and is, in addition, subject to deterioration under the effects of climate and temperatures because of the resin used as a material. All these conspired to produce changes in the element characteristics with a lapse of years and fomented uncertainty in point of reliability on its use.

2. Deterioration in mechanical strength due to repreated thermal stresses:

The transistor of this type must have also the capacity to sufficiently resist severe temperature conditions. Because of this fact the transistor is forcedly subjected to repeated cooling and heating tests in the range of temperature of −60° to +150°C. As apparent from the above description of its structure, the prior art type transistor has the base *e* brought into contact with the entire top surface of the stud *a*, in which case the copper of the stud *a* is about twice as high in thermal expansion coefficient as the beryllium of the base *b* (the former is $15 \times 10^{-6}$ and the latter $7 \times 10^{-6}$ in coefficient of linear expansion). From this fact it is concluded that, because thermal stress produced by difference in heat expansion is centered on the interface between the two members *a* and *b* when the aforestated repetition of cooling and heating is carried out, and particularly because the two members *a* and *b* have contact fixing surfaces extending over the entire range of their wide surfaces, repetition of such severe heat tests produced cracks and fissures due to thermal stress at the end of the base *b* and greatly shortened the service life of the transistor.

Similar heat effects were produced on the corresponding part of the base *b* in contact with leads *g*. The results of the described cooling and heating tests ultimately showed that the transistor was unexpectedly fragile in heat effect.

SUMMARY OF THE INVENTION

This invention has generally solved the above problematic points (1) and (2), and has for its primary object the provision of a semiconductor device capable of preventing cracks and fissures produced by difference in thermal expansion between both an insulating base and a metal base for a semiconductor element.

Another object of the invention is to provide a semiconductor device that does not produce cracks and fissures in the members in contact with the lead connected parts.

Still another object of the invention is to provide a semiconductor device greatly increased in airtightness by use of hermetic seal.

Still another object of the invention is to provide a semiconductor device having highly reliable and thermally strong characteristics attainable by three objects described above.

Other objects and advantages of the invention will become apparent from the illustration and description of the invention embodied in its most preferred form.

DESCRIPTION OF THE PREFERRED EMBODIMENTS

Figure 1:
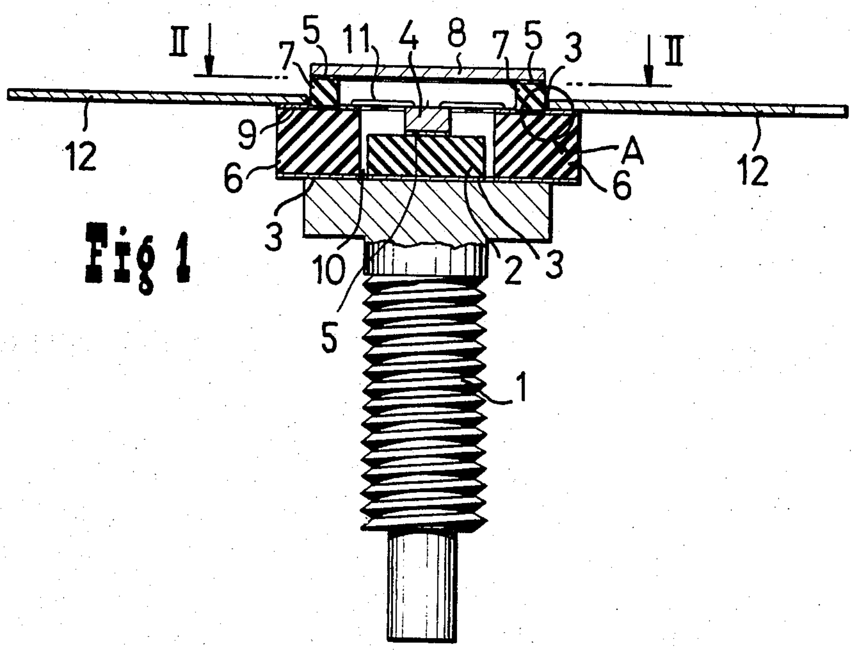
FIG. 1 is a longitudinal sectional front elevation of an embodiment of a power transistor of this invention used as a power transistor for high frequency.
Figure 2:
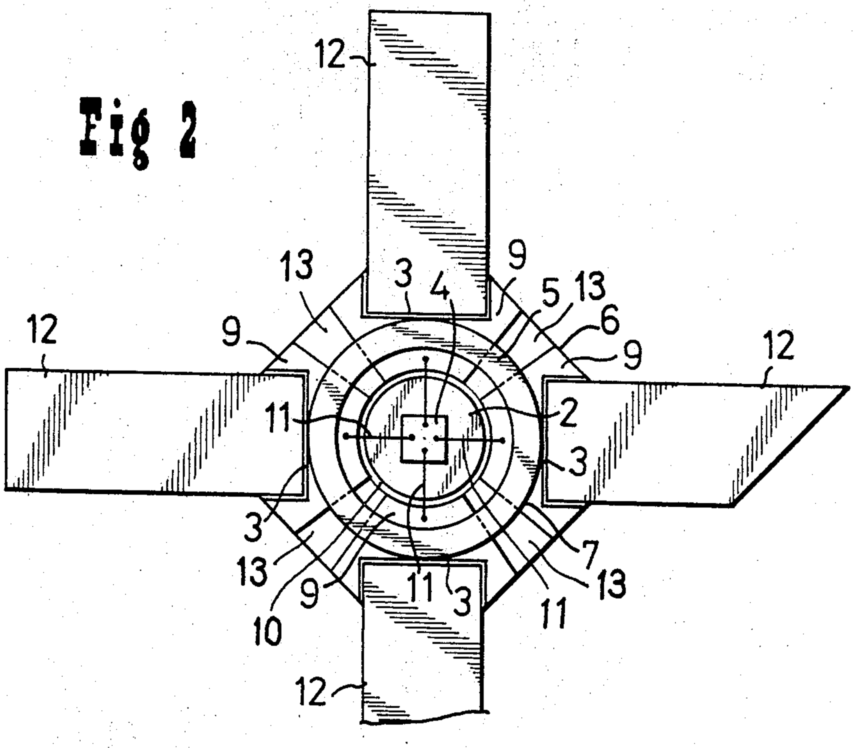
FIG. 2 is a plan view of the embodiment in FIG. 1 taken along its II — II line.
Figure 3:
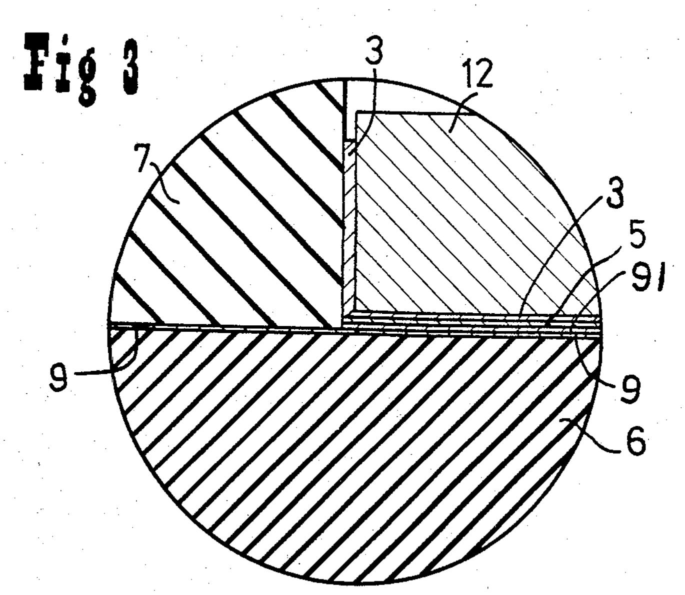
FIG. 3 is a sectional view of portion A of FIG. 1 and shown in enlarged scale.
Figure 4:
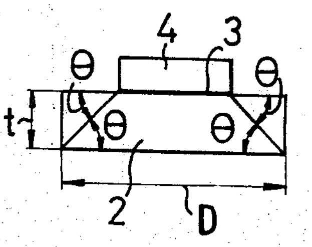
FIG. 4 is a diagram showing the relative size relation between an element and a base for the element considering the range of heat radiation and transfer.
Figure 5:
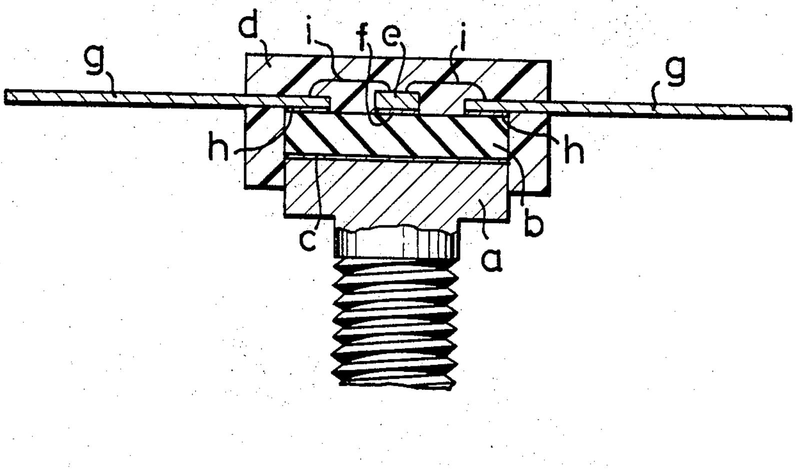
Fig 5 (Prior Art)
FIG. 5 is a sectional front elevation, broken in part, of the prior type transistor for high frequency use.

Referring now to FIGS. 1 and 2, the numeral 1 designates a nonoxygen copper stud, and 2 designates an insulating base for supporting an element and fixed with Au-Si eutectic alloy solder 3 to the center of the top surface of the stud 1 at about 800°C, said base being of disc-like good heat conducting ceramics, for example, beryllium ceramics. As apparent from the drawings, this base 2 is made smaller in diameter (or diagonal) than the one in general use so that the stud may come into contact within a small range with approximately the center of the top surface of the stud 1 (about one-half of the diameter of the top surface of the stud in the case shown). In view of the fact that, as shown in FIG. 4, the heat conducting area of a semiconductor element 4 which conducts heat downwards extends from the bottom end edge of the element 4, downwardly and normally within the range of a sector defined by angles of attack $\theta = 45°$ on the right and left sides. The width (or diameter) D of the bottom surface of the base 2 is equal to or, allowance considered, longer than the base of a trapezoid formed by the sector ($\theta$) and thickness $t$.

In this invention another insulating member 6 that encloses the base 2 at a small space 10 from the base 2 is provided outside the base 2 so as to not contact the base, and an insulating housing 7 is connected to the top of the member 6 through an electroconducting area 9 to form the housing 7 and the member 6 into one body. Namely, this insulating member 6 serves to fix the stud and also to connect leads, and the numeral 7 designates a housing which is used for fixing a cap. Both the insulating member 6 and the housing 7 are not only superior in heat conductivity but also excellent in mechanical strength (mechanical strength at high temperatures) and are made of ceramics capable of being sintered into one body, for example, alumina ceramics completely sintered, and the two members are integrated in such a manner that two raw alumina materials molded into cylindrical shapes respectively by a conventional multiple-layer method are sintered into one body with one laid over the other through the metalized electroconducting area 9 placed therebetween. Stated more particularly, a ring-shaped electroconducting area 9 (four poles herein) with broken parts 13 . . . left intermediately, as shown in FIG. 2, is formed by printing tungsten paste or Mo-Mn alloy paste 9 on the surface of the insulating member 6 of a raw alumina ceramic material, and a housing 7 of a raw alumina ceramic material for securing a cap of suitable height is laid over the member 6 thus formed, and both housing 7 and the member 6 are sintered under a reducing atmosphere of 1,600°–1,700°C into one body and the printed part of said conducting areas 9 . . . are metalized. Next, the thus metalized conducting areas 9 . . . are plated on their exposed surfaces with nickel 91 and then sintered at about 1,000°C under reduced atmosphere and thereafter the areas thus plated with nickel 91 are further covered in thin layer with Au-Si eutectic alloy solder 5 at about 300°C. In this manner, the insulating member integrally united with the housing 7 is fixed with Ag-Cu eutectic alloy solder 3 to the top surface of the stud 1. An element 4 is fixed to the top surface of the base 2 by use of Au-Si eutectic alloy solder 5 and the element 4 is connected by wire bondings 11 to each of the conducting areas 9. Four leads 12 are connected to the electroconducting areas 9 of the member 6, namely four leads each are integrally bonded with a layer of Au-Si solder 5 formed over the electroconducting areas 9 by use of Ag-Cu eutectic alloy solder 3. Upon completion of the specified connection in this manner, a disc-shaped cap 8 is fixed with Au-Si eutectic alloy solder 5 to the top surface of the housing 7 to seal hermetically the housing 7 with an airtight cap 8 and thereby to finish assembling. As the airtight cap 8 is used a material such as for example "Cobal" (trademark) (Co-Ni-Fe alloy), which is high in airtightness and low in coefficient of thermal expansion approximate to alumina ceramics, or metal such as molybdenum, tungsten, or other ceramics and glass or the like approximate in coefficient of thermal expansion to alumina ceramics, and hermetic sealing by use of such a cap can provide very high airtightness (calculated at $10^{-10}$ Torr).

Since the power transistor according to the invention is of the construction described above, loss heat from the element 4 is radiated from the base 2 of beryllium ceramics immediately below the element 4 through the copper stud 1 to a chassis not shown so as to maintain proper working temperatures of the element 4. The characteristic features of the embodiment reside in the structure in which the base 2 is made small so as not to contact with entire stud surface, the base 2 (of beryllium ceramics) exhibits good heat conductivity and comes into contact with the stud within the narrowest possible range effective for radiating the heat to approximately the center surface of the stud; in the provision of the member 6 of alumina ceramics having the same good heat conductivity and mechanical property as the material of the base 2 and having, for example, a thermal expansion coefficient approximating that of beryllium ceramics and yet having twice as great a value in strength, the member 6 being located in such a manner that it will not contact the base 2 and in order for the member 6 to support and receive leads 12; in sintering the member 6 and the member 7, having the same property as the member 6, into one body according to the multiple-layer method; and in hermetic sealing of the top of the thus integrated body with the cap 8 made of airtight material.

The reduction of contact surface between the base 2 and the stud 1 brought about by the structure of the kind described involves great decrease in the thermal stresses of interface between both members deduced from the relationship that thermal stress is approximately proportional to coefficient times (x) surface. Thus, the present invention tends to prevent the production of cracks and fissures due to thermal stress centered by repetition of cooling and heating tests on the end surface of the element supporting base 2. In addition, the insulating member 6 to which leads 12 . . . are connected is superior in heat conductivity and mechanical strength and accordingly even if the member 6 is in contact with and fixed to the top surface of the stud 1 and the leads 12 . . . over a relatively wide surface and a great difference in thermal expansion may exist between the two members, not only superiority of the members in mechanical strength ultimately provides no possibility of cracks and fissures being produced but also a noncontact relation between the base 2 and the member 6 can prevent thermal interference between both members.

The transistor and package structure of this invention, because of the structural features described above, is extremely smaller in the thermal reduction of mechanical strength than the prior art type transistor. The invention has made it possible to abandon the resin powder heat pressure filling method heretofore used in hermetic sealing of the header and cap and to use a plate-shaped cap 8, and accordingly the employment of a hermetic sealing mechanism by use of an airtight reliable transistor excellent in airtightness and free from changes effected by lapse of time. Both points of problem (1) and (2) referred to in conjunction with the known header can be brought to a satisfactory solution by the facts disclosed above.

Although the invention has so far been described with reference to the invention embodied by way of example in a high-frequency power transistor, it should be understood that the invention could also find other wide application in a semiconductor device including a power regulating element such as Thyristor, Triac or the like and power IC or the like and that the respective materials, shapes and sizes of the stud 1, insulating base 2, insulating member 6, insulating housing 7 and cap 8, the material of the leads 12, the material, shape and number of poles of the electroconducting area 9, metalizing process, soldering of members, etc. shown by way of example in the description of the invention are not limited to the embodiment shown but various replacements, additions and modifications could be made without departing from the scope and spirit of the invention.

We claim:

1. In an hermetic power package for a high frequency solid state element employing a conductive stud the improvement comprising an insulating base of beryllium ceramics, said base being adapted to support said solid state element and fixedly secured to the top surface of said stud without an intervening discrete member, an insulating member of alumina ceramics separated from said insulating base and enclosing the outside of the base in a non-contacting manner, said insulating member having a thickness greater than that of the insulating base so that the top surface thereof extends above the top surface of said insulating base, said insulating member of alumina ceramic fixedly secured to the top surface of said stud of high purity copper without an intervening discrete member, an electrical conducting area formed on the top surface of said insulating member, an insulating housing of alumina ceramics formed integrally with said insulating member on the top surface thereof and in part over said electrical conducting area, said insulating housing configured to expose said electrical conducting area whereby said electrical conducting area passes through said integrally formed insulating member and insulating housing, and an air tight cap adapted to be hermetically sealed to said insulating housing whereby an hermetically sealed enclosure is formed by said insulating member, said insulating housing, said cap on said stud with said electrical conducting area enabling electrical interconnection to said solid state element in said enclosure.

2. The package defined in claim 1 wherein the width of the bottom surface of said insulating base is determined by extending angles at approximately 45 degrees respectively to the right and left sides from below the bottom edge of the semiconductor element located at a position approximately equal to the thickness of said insulating base whereby the conductivity of said insulating base is substantially utilized and said insulating base is maintained at a minimum dimension.

3. The package defined in claim 1 wherein said electrical conducting area is formed of a plurality of ring-shaped areas made independent from each other by broken parts formed therebetween.

4. The package defined in claim 1 wherein said insulating base and said insulating member are fixedly attached to said stud by an Ag-Cu solder.

5. The package defined in claim 1 wherein said stud is copper and said solid state element is a semiconductor element.

* * * * *